US011380741B2

(12) United States Patent
Yang et al.

(10) Patent No.: US 11,380,741 B2
(45) Date of Patent: Jul. 5, 2022

(54) DOUBLE-SIDED DISPLAY PANEL AND MANUFACTURING METHOD, DRIVING CIRCUIT AND DRIVING METHOD

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN); Chunlei Wang, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 611 days.

(21) Appl. No.: 16/343,775

(22) PCT Filed: Oct. 30, 2018

(86) PCT No.: PCT/CN2018/112576
§ 371 (c)(1),
(2) Date: Apr. 21, 2019

(87) PCT Pub. No.: WO2019/205547
PCT Pub. Date: Oct. 31, 2019

(65) Prior Publication Data
US 2021/0327976 A1    Oct. 21, 2021

(30) Foreign Application Priority Data

Apr. 27, 2018 (CN) .......................... 201810392255.5

(51) Int. Cl.
*H01L 27/32* (2006.01)
*G09G 3/3233* (2016.01)
(Continued)

(52) U.S. Cl.
CPC ....... *H01L 27/3244* (2013.01); *G09G 3/3233* (2013.01); *H01L 51/0023* (2013.01);
(Continued)

(58) Field of Classification Search
CPC ... G09G 2300/0804; G09G 2300/0819; G09G 2300/0842; G09G 2300/0861;
(Continued)

(56) References Cited

U.S. PATENT DOCUMENTS

| 9,173,272 B2* | 10/2015 | Lee ...................... G09G 3/3225 |
| 2014/0306204 A1* | 10/2014 | Niu .......................... H01L 51/56 257/40 |

(Continued)

FOREIGN PATENT DOCUMENTS

| CN | 107331351 A | 11/2017 |
| CN | 107657922 A | 2/2018 |
| CN | 107863372 A | 3/2018 |

OTHER PUBLICATIONS

International Search Report in Application No. PCT/CN2018/112576, dated Feb. 12, 2019.

*Primary Examiner* — Afroza Chowdhury
(74) *Attorney, Agent, or Firm* — Syncoda LLC; Feng Ma

(57) ABSTRACT

A display panel includes a plurality of display elements over a substrate, each including at least one first light-emitting element for emitting a first light out of a first light-emitting surface and at least one second light-emitting element for emitting a second light out of a second light-emitting surface opposing to the first light-emitting surface. Each first light-emitting element has a first light-emitting layer between two first electrodes, which are respectively transparent and reflective so that the first light can transmit out of the first light-emitting surface. Each second light-emitting element includes a second light-emitting layer between two second electrodes, which are respectively transparent and reflective
(Continued)

so that the second light transmits out of the second light-emitting surface. The first and second light-emitting surface are below and over the substrate respectively. A driving circuit is configured to drive the display panel.

19 Claims, 8 Drawing Sheets

(51) Int. Cl.
  *H01L 51/52* (2006.01)
  *H01L 51/00* (2006.01)
  *H01L 51/56* (2006.01)

(52) U.S. Cl.
  CPC ...... *H01L 51/5218* (2013.01); *H01L 51/5234* (2013.01); *H01L 51/56* (2013.01); *G09G 2300/0804* (2013.01); *G09G 2320/043* (2013.01); *G09G 2330/021* (2013.01); *H01L 2251/308* (2013.01); *H01L 2251/5323* (2013.01)

(58) Field of Classification Search
  CPC ....... G09G 2320/043; G09G 2330/021; G09G 3/3233; H01L 2251/308; H01L 2251/5323; H01L 27/3244; H01L 27/3248; H01L 27/3267; H01L 51/0023; H01L 51/5218; H01L 51/5234; H01L 51/56
  See application file for complete search history.

(56) References Cited

U.S. PATENT DOCUMENTS

2016/0020263 A1* 1/2016 Xu ..................... H01L 27/3272
                                                     257/40
2019/0081122 A1* 3/2019 Kim ................... H01L 27/3248

* cited by examiner

DOUBLE-SIDED DISPLAY PANEL AND MANUFACTURING METHOD, DRIVING CIRCUIT AND DRIVING METHOD

CROSS-REFERENCE TO RELATED APPLICATION

The present application claims priority to Chinese Patent Application No. 201810392255.5 filed on Apr. 27, 2018, the disclosure of which is hereby incorporated by reference in its entirety.

TECHNICAL FIELD

The present disclosure relates generally to the field of display technologies, and more specifically to a double-sided display panel and a manufacturing method thereof and a driving circuit and a driving method thereof.

BACKGROUND

Organic light-emitting display (OLED) has the advantages including self-luminosity, fast response speed, wide view angle, high brightness, brilliant color, thinness, and lightness, and it has been regarded as a next-generation display technology.

According to different light-emitting methods of the OLED display devices in relevant technologies, OLED display device is classified into bottom-emitting type OLED and top-emitting type OLED.

Regardless of the different light-emitting types, existing OLED display devices typically can emit lights from only one side (i.e. the light-emitting side or the display side) of the display devices and are thus substantially single-sided display devices. How to realize the emission of lights from two opposing side of the OLED display devices to thereby obtain a substantially double-sided OLED display device remains an issue to be solved.

SUMMARY

The purpose of the present disclosure is to provide a double-sided display panel and manufacturing method thereof and a driving circuit and manufacturing method thereof to achieve a double-sided display device that has a simple structure and good display effect.

In a first aspect, the present disclosure provides a display panel.

The display panel comprises a substrate and a plurality of display elements over the substrate. Each of the plurality of display elements comprises at least one first light-emitting element and at least one second light-emitting element, configured to respectively emit a first light out of a first light-emitting surface, and a second light out of a second light-emitting surface opposing to the first light-emitting surface, of the display panel.

Each of the at least one first light-emitting element comprises a first light-emitting layer sandwiched between two first electrodes. The two first electrodes are configured to be respectively transparent and reflective so that the first light emitted by the first light-emitting layer transmits out of the first light-emitting surface of the display panel.

Each of the at least one second light-emitting element comprises a second light-emitting layer sandwiched between two second electrodes. The two second electrodes are configured to be respectively transparent and reflective so that the second light emitted by the second light-emitting layer transmits out of the second light-emitting surface of the display panel.

Herein, the first light-emitting surface is below the substrate, and the second light-emitting surface is over the substrate.

According to some embodiments of the display panel, the two first electrodes in each of the at least one first light-emitting element comprise a first anode and a first cathode. The first anode, the first light-emitting layer, and the first cathode are sequentially disposed over the substrate; the first anode comprises a first transparent conductive material; and the first cathode comprises a first reflecting conductive material.

In addition, the two second electrodes in each of the at least one second light-emitting element comprise a second anode and a second cathode. The second anode, the second light-emitting layer, and the second cathode are sequentially disposed over the substrate; the second anode comprises a second reflecting conductive material; and the second cathode comprises a second transparent conductive material.

According to some embodiments of the display panel, each of the plurality of display elements further comprises a driving circuit, and the driving circuit is configured to provide driving signals to each of the at least one first light-emitting element and each of the at least one second light-emitting element.

Optionally, the driving circuit can be arranged between a substrate and one of the two second electrodes that is reflective, and it is configured such that an orthographic projection of the driving circuit on the substrate is at least partially overlapped with an orthographic projection of the one of the two second electrodes on the substrate.

Optionally, the driving circuit can comprise a pixel compensation circuit, which has a signal output terminal that is electrically coupled to each of the at least one first light-emitting element and each of the at least one second light-emitting element, such that each of the at least one first light-emitting element and each of the at least one second light-emitting element receives substantially same driving signals from the pixel compensation circuit.

Optionally, the driving circuit can include a pixel compensation circuit, a first control circuit and a second control circuit. The first control circuit is electrically coupled to a signal output terminal of the pixel compensation circuit and the at least one first light-emitting element respectively, and is configured to control whether or not the signal output terminal of the pixel compensation circuit is electrically connected to the each of the at least one second light-emitting element. The second control circuit is electrically coupled to the signal output terminal of the pixel compensation circuit and the at least one second light-emitting element respectively, and is configured to control whether or not the signal output terminal of the pixel compensation circuit is electrically connected to the each of the at least one second light-emitting element.

According to some embodiments of the display panel, in each of the plurality of display elements, a number of the at least one first light-emitting element is different from a number of the at least one second light-emitting element.

According to some other embodiments of the display panel, in each of the plurality of display elements, a number of the at least one first light-emitting element is equal to a number of the at least one second light-emitting element. As such, an area of a first light-emitting region formed by each of the at least one first light-emitting element is substantially equal to an area of a second light-emitting region formed by each of the at least one second light-emitting element.

Herein, each of the plurality of display elements can consist of one first light-emitting element and one second light-emitting element.

According to some embodiments of the display panel, the at least one first light-emitting element in each of the plurality of display elements together form a plurality of first light-emitting elements, and the at least one second light-emitting element in each of the plurality of display elements together form a plurality of second light-emitting elements. Furthermore, the plurality of first light-emitting elements and the plurality of second light-emitting elements are alternately arranged.

In the display panel, it can optionally be configured such that at least one pair of the first anode and the second anode, the first light-emitting layer and the second light-emitting layer, and the first cathode and the second cathode is arranged at a substantially same layer.

In the display panel described above, the first transparent conductive material can optionally comprise at least one of indium tin oxide (ITO) or indium zinc oxide (IZO), and/or the second transparent conductive material can comprise at least one of a magnesium-silver alloy or indium zinc oxide (IZO).

In the display panel described above, the first reflecting conductive material can optionally comprise at least one of a silver-aluminum alloy, or a material having a stacked structure comprising IZO and aluminum.

In the display panel described above, the second reflecting conductive material can optionally comprise at least one of silver or a material having a stacked structure comprising silver and indium tin oxide.

In a second aspect, the present disclosure further provides a driving circuit for driving a display panel according to any one of the embodiments as described above.

The driving circuit comprises a pixel compensation circuit, and the pixel compensation circuit comprises a driving sub-circuit, a data writing sub-circuit, a power source control sub-circuit, a resetting sub-circuit, a capacitance element, and a compensation sub-circuit.

The driving sub-circuit comprises a driving transistor, wherein a first electrode of the driving transistor is electrically coupled to a signal output terminal of the pixel compensation circuit.

The data writing sub-circuit is electrically coupled to a gate line of a corresponding row, a data line of a corresponding column, and a second electrode of the driving transistor, respectively, and is configured to control whether or not to electrically connect the data line and the second electrode of the driving transistor under control of the gate line.

The power source control sub-circuit is electrically coupled to a power source control terminal, a power source signal input terminal, and the second electrode of the driving transistor, respectively, and is configured to control whether or not to electrically connect the power source signal input terminal and the second electrode of the driving transistor under control of the power source control terminal.

The resetting sub-circuit is electrically coupled to a resetting control terminal, a gate electrode of the driving transistor, and a first electric level input terminal, respectively, and is configured to control whether or not to electrically connect the gate electrode of the driving transistor and the first electric level input terminal under control of the resetting control terminal.

The capacitance element comprises a first terminal and a second terminal, wherein the first terminal and the second terminal are electrically connected to the gate electrode of the driving transistor, and to the first electric level input terminal, respectively.

The compensation sub-circuit is electrically coupled to the gate line, the gate electrode of the driving transistor, and the first electrode of the driving transistor, respectively, and is configured to control whether or not to electrically connect the gate electrode of the driving transistor and the first electrode of the driving transistor under control of the gate line.

Herein, optionally, the first electric level input terminal can be a ground terminal.

According to some embodiments of the disclosure, the driving circuit further includes a light-emitting control sub-circuit. The light-emitting control sub-circuit is electrically coupled to the power source control terminal, the first electrode of the driving transistor, and the signal output terminal, respectively, and is configured to control whether or not to electrically connect the first electrode of the driving transistor and the signal output terminal under control of the power source control terminal.

According to some embodiments of the disclosure, the driving circuit further comprises a first control circuit and a second control circuit.

The first control circuit comprises at least one first control sub-circuit, wherein each of at least one first control sub-circuit is electrically coupled to the signal output terminal of the pixel compensation circuit, a first control terminal, and one of two first electrodes in each of the at least one first light-emitting element, respectively, and is configured to control whether or not the signal output terminal of the pixel compensation circuit is electrically connected to the one of two first electrodes under control of the first control terminal.

The second control circuit comprises at least one second control sub-circuit, wherein each of at least one second control sub-circuit is electrically coupled to the signal output terminal of the pixel compensation circuit, a second control terminal, and one of two second electrodes in each of the at least one second light-emitting element, respectively, and is configured to control whether or not the signal output terminal of the pixel compensation circuit is electrically connected to the one of two second electrodes under control of the first control terminal;

In a third aspect, the present disclosure further provides a method for driving a driving circuit according to any one of the embodiments as described above. The method comprises a resetting stage, a discharge compensation stage, and a light-emitting stage.

In the resetting stage, under control of the resetting control terminal, the resetting sub-circuit controls that the gate electrode of the driving transistor is electrically connected with the first electric level input terminal, such that an electric level of the gate electrode of the driving transistor receives a first electric level from the first electric level input terminal.

In the discharge compensation stage, the first electric level controls that the driving transistor is turned on; the data line of corresponding column inputs a data voltage Vdata; under control of the gate line of corresponding row, the data writing sub-circuit controls that the data line of corresponding column is electrically connected with the second electrode of the driving transistor; the compensation sub-circuit controls that the gate electrode of the driving transistor is electrically connected with the first electrode of the driving transistor, so that the data voltage Vdata in turn passes through the data writing sub-circuit, the driving transistor, and the compensation sub-circuit to be written into the gate electrode of the driving transistor, until the electric level of the gate electrode of the driving transistor becomes Vdata+ Vth, wherein Vth is a threshold voltage of the driving transistor.

In the light-emitting stage, under control of the power source control terminal, the power source control sub-circuit controls that the power source signal input terminal is electrically connected with the second electrode of the driving transistor; then the driving transistor generates, and output from the signal output terminal, a driving signal.

In a fourth aspect, the disclosure further provides a method for manufacturing a display panel according to any one of the embodiments as described above.

The manufacturing method comprises the following steps:

providing a substrate;

forming a first anode and a second anode over the substrate, wherein the first anode comprises a transparent conductive material, and the second anode comprises a reflecting conductive material;

forming a first light-emitting layer and a second light-emitting layer over the first anode and the second anode respectively; and forming a first cathode and a second cathode over the first light-emitting layer and the second light-emitting layer respectively, wherein the first cathode comprises a reflecting conductive material, and the second cathode comprises a transparent conductive material.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, embodiments of the present disclosure provide a double-sided display panel.

Figure 1:
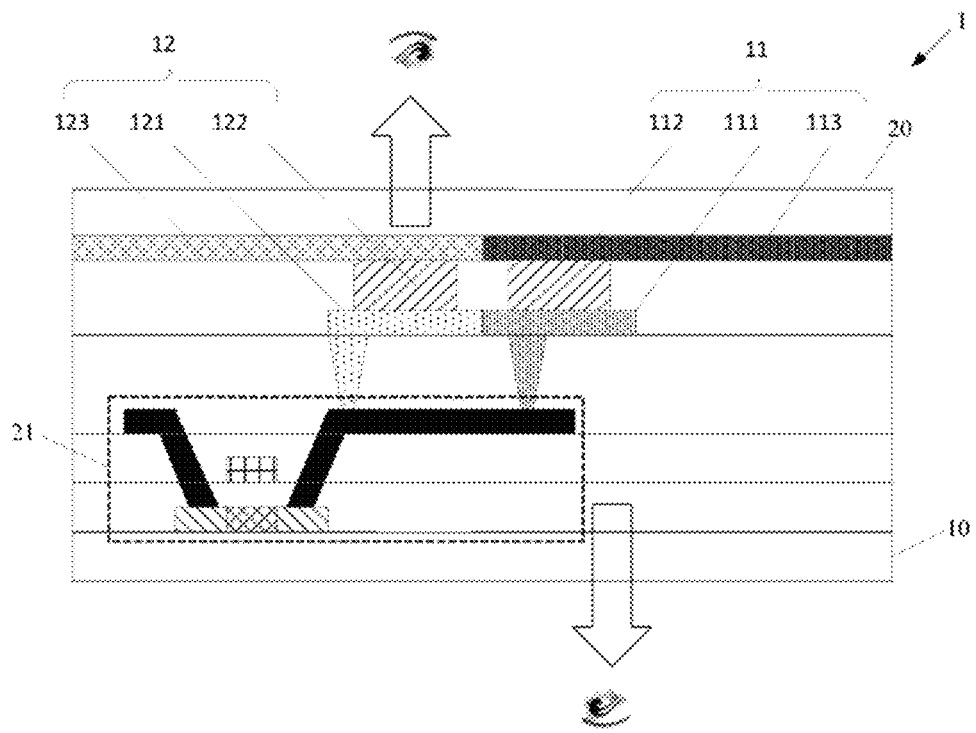
FIG. 1 is a structural diagram of a double-sided display panel according to some embodiments of the present disclosure.

FIG. 1 illustrates a structural diagram of a double-sided display panel according to some embodiments of the disclosure. The display panel comprises a substrate 10, and a plurality of display elements over the substrate 10. Specifically over the substrate 10, the plurality of display elements are arranged in an array. Each of the plurality of display elements comprises a first light-emitting element 11 and a second light-emitting element 12. Please note that for conciseness, only one display element is illustrated in FIG. 1.

The first light-emitting element 11 comprises a first anode 111, a first light-emitting layer 112 and a first cathode 113, which are stacked successively or sequentially in layers. The first anode 111 is arranged between the first light-emitting layer 112 and the substrate 10.

The second light-emitting element 12 comprises a second anode 121, a second light-emitting layer 122 and a second cathode 123, which are also stacked successively in layers. The second anode 121 is arranged between the second light-emitting layer 122 and the substrate 10.

On the one hand, the first light-emitting element 11 is configured such that the first anode 111 comprises a first transparent conductive material, and the first cathode 113 comprises a first reflecting conductive material, so that lights generated in the first light-emitting layer 112 of the first light-emitting element 11 can only emit out of the double-sided display panel through a surface thereof that is proximal to the substrate 10 (i.e. the bottom surface of the display panel 1, as illustrated by the downward arrow in FIG. 1).

On the other hand, the second light-emitting element 12 is configured such that the second anode 121 can comprise a second reflecting conductive material, and the second cathode 123 can comprise a second transparent conductive material, so that lights generated in the second light-emitting layer 122 of the second light-emitting element 12 can only emit out of the double-sided display panel through a surface thereof that is distal to the substrate 10 (i.e. the top surface of the display panel 1, as illustrated by the upward arrow in FIG. 1).

In practice, when the aforementioned double-sided display panel is working, a driving circuit 21 that is provided in the double-sided display panel 1 can be configured to drive the first light-emitting element 11 and the second light-emitting element 12 to emit lights (i.e. first lights and second lights respectively).

Specifically, the driving circuit 21 drives the first light-emitting element 11 to emit the first lights, which can transmit through the first anode 111 to thereby exit out of the double-sided display panel through the bottom surface. For this purpose, the first anode 111 can be made of a transparent conductive material (i.e. the first transparent conductive material).

The driving circuit 21 also drives the second light-emitting element 12 to emit the second lights, which can transmit through the second cathode 123 to thereby exit out of the double-sided display panel through the upper surface. For this purpose, the second cathode 123 can be made of a transparent conductive material (i.e. the second transparent conductive material).

In addition, because the first cathode 113 is made of a reflecting conductive material (i.e. the first reflecting conductive material), it can reflect the first lights emitted from the first light-emitting layer 112 and reaching the first cathode 113 back in a direction towards the first anode 111 (i.e. downward direction), and the first lights reflected then exit out of the double-sided display panel 1.

Because the second anode 121 is made of a reflecting conductive material (i.e. the second reflecting conductive material), it can reflect the second lights emitted from the second light-emitting layer 122 and reaching the second anode 121 back in a direction towards the second cathode 123 (i.e. upward direction), and the second lights reflected then transmit out of the double-sided display panel 1.

Furthermore, because the first anode 111 is located between the first light-emitting layer 112 and the substrate 10, and the second anode 121 is located between the second light-emitting layer 122 and the substrate 10, the first lights emit out through the first anode 111 of the double-sided display panel 1, whereas the second lights emit out through the second cathode 123 of the double-sided display panel 1.

Thus in the double-sided display panel described above, the first lights emitted from the first light-emitting element 11 and the second lights emitted from the second light-emitting element 12 can emit out from two different display sides (i.e. bottom side and top side) of the double-sided display panel 1 respectively. Thereby a double-sided display can be realized for the display panel.

Taken the above together, the double-sided display panel 1 according to the embodiments described above comprises a plurality of display elements arranged in an array and disposed over a substrate 10. Each display element comprises a first light-emitting element 11 and a second light-emitting element 12. First lights emitted by the first light-emitting element 11 and second lights emitted by the second light-emitting element 12 can respectively emit out from the two opposing sides of the double-sided display panel 1, thereby the double-sided display function of the double-sided display panel is achieved.

It can be seen that in the double-sided display panel 1 described above, the double-sided display function is substantially realized by configuring that in the first light-emitting element 11, the first anode 111 comprises a first transparent conductive material and the first cathode 113 comprises a first reflecting conductive material, whereas in the second light-emitting element 12, the second anode 121 comprises a second reflecting conductive material and the second cathode 123 comprises a second transparent conductive material.

As a result, the first lights emitted by the first light-emitting element 11 and the second lights emitted by the second light-emitting element 12 can both emit out from their respective display sides of the double-sided display panel 1 with higher light energy, thereby ensuring a good display effect of the double-sided display panel 1. Therefore, the double-sided display panel 1 described above not only has a simple structure, but also can realize a good display effect.

In addition, the double-sided display panel 1 described above can have many practical applications, thus having a very high added value as a display product.

In the above mentioned embodiments of the double-sided display panel 1, the double-sided display panel comprises a plurality of display elements, and each of the plurality of display elements can comprise a first light-emitting element 11 and a second light-emitting element 12. In other words, in the above mentioned embodiments of the double-sided display panel 1, the double-sided display panel 1 substantially includes a plurality of first light-emitting elements 11 and a plurality of second light-emitting elements 12.

Figure 8:
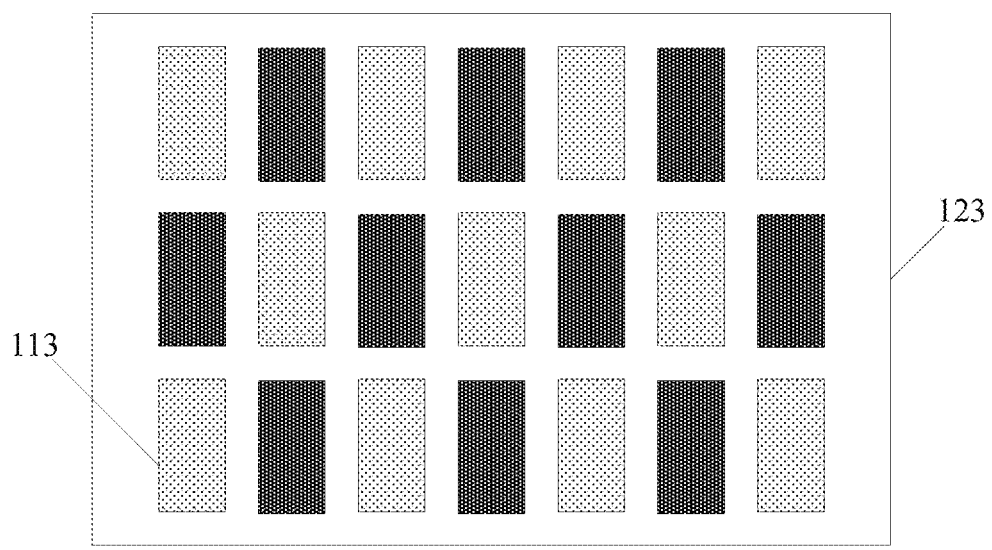
FIG. 8 is a diagram of the first cathode and second cathode formed by means of the mask shown in FIG. 7.

In these above mentioned embodiments of the double-sided display panel 1, there can be a variety of manners for arranging the plurality of first light-emitting elements 11 and the plurality of second light-emitting elements 12. For example, the plurality of first light-emitting elements 11 and the plurality of second light-emitting elements 12 can be arranged alternately on the double-sided display panel 1, as illustrated in FIG. 8 in a following section of the disclosure.

In embodiments where the plurality of first light-emitting elements 11 and the plurality of second light-emitting elements 12 are arranged alternately in the double-sided display panel 1, the plurality of first light-emitting elements 11 and the plurality of second light-emitting elements 12 can have substantially even distributions in the whole display region of the double-sided display panel 1. As a result, no matter which viewing angle and which view side a viewer takes in viewing the display region of the double-sided display panel 1, the viewer can have good visual experience.

In addition, the double-sided display panel according to the above embodiments can be further configured such that an area of a first light-emitting region formed by each first light-emitting element 11 is substantially equal to an area of a second light-emitting region formed by each second light-emitting element 12. As such, if only one driving circuit 21 is used to drive light emission of the first light-emitting region and of the second light-emitting region, substantially equal imaging effects can be obtained from the first light-emitting region and the second light-emitting region.

It is noted that according to some other embodiments of the disclosure, the double-sided display panel 1 also comprises a plurality of display elements, and each of the plurality of display elements can comprise more than two light-emitting elements (e.g. a number of the plurality of first light-emitting elements 11 and/or a number of the plurality of second light-emitting elements 12 can be more than one), which can be configured to be evenly distributed in the each of the plurality of display elements.

Optionally, the double-sided display panel 1 can be configured such that the number of the plurality of first light-emitting elements 11 and a number of the plurality of second light-emitting elements 12 can be different. In one illustrating example, each display element comprises three light-emitting elements, specifically including one first light-emitting element 11 and two second light-emitting elements 12. As such, in these above embodiments of the double-sided display panel, the two sides of the double-sided display panel 1 can have different resolutions, which can satisfy special display requirements.

Herein, it should be noted that the first light-emitting element(s) 11 and the second light-emitting element(s) 12 in the double-sided display panel 1 can be arranged according to practical needs, and it is not limited to the alternate arrangement method as mentioned above.

Optionally, in any of the embodiments of the double-sided display panel described above, the various film layers in the first light-emitting element 11 (i.e. the first anode 111, the first light-emitting layer 112, and the first cathode 113) and the various film layers in the second light-emitting element 12 (i.e. the second anode 121, the second light-emitting layer 122, and the second cathode 123) can have a variety of configuration locations, as long as the first anode 111 is arranged between the first light-emitting layer 112 and the substrate 10, and the second anode 121 is arranged between the second light-emitting layer 122 and the substrate 10.

According to some preferred embodiments, the first anode 111 and the second anode 121 are configured at a substantially same layer, the first light-emitting layer 112 and the second light-emitting layer 122 are configured at a substantially same layer, and the first cathode 113 and the second cathode 123 are configured at a substantially same layer.

As such, in these above mentioned embodiments of the double-sided display panel, each film layer in the first light-emitting element 11 and each film layer in the second light-emitting element 12 are configured at a substantially same layer, which can ensure that the display elements (including the first light-emitting element 11 and the second light-emitting element 12) occupy smallest thickness in the double-sided display panel, so that it is more advantageous for ensuring that the double-sided display panel 1 is thin.

In addition, such a configuration further allows that each pair of the first light-emitting layer 112 and the second light-emitting layer 122, the first anode 111 and the second anode 121, and/or the first cathode 113 and the second cathode 123, can be formed though a shared one-time patterning process. As such, the manufacturing process can be effectively simplified, and the manufacturing cost can be effectively reduced as a result.

Figure 2:
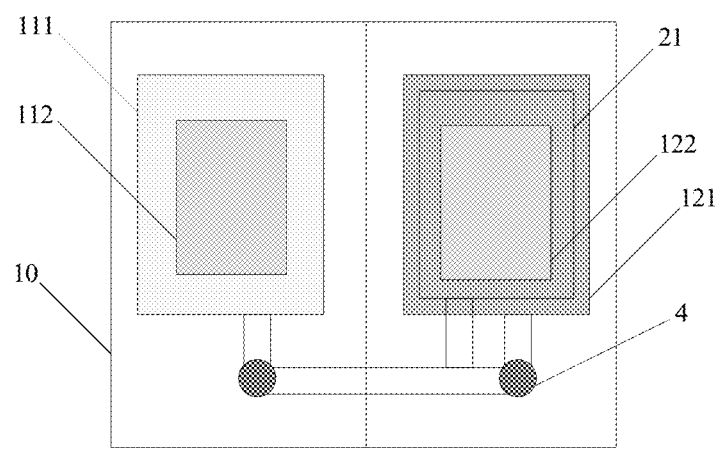
FIG. 2 is a top view of the first light-emitting element and the second light-emitting element according to some embodiments of the present disclosure.
Figure 3:
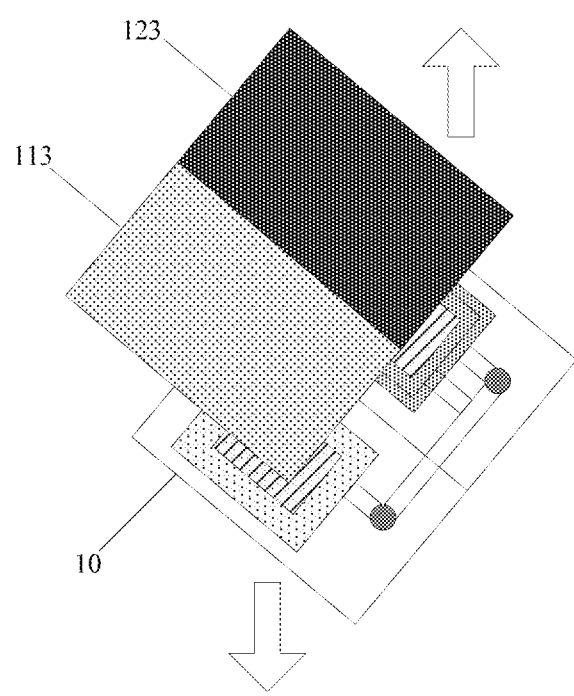
FIG. 3 is a perspective view of the first light-emitting element and second light-emitting element in the double-sided display panel according to some embodiments of the present disclosure.

In any of embodiments of the double-sided display panel 1 described above, the double-sided display panel 1 further comprises a driving circuit 21, as illustrated in one embodiment shown in FIG. 2 and FIG. 3. In the embodiment of the double-sided display panel 1 shown in FIG. 2 and FIG. 3, the driving circuit 21 is specifically arranged between the substrate 10 and the second anode 121.

Specifically, in the aforementioned double-sided display panel 1, the driving circuit 21 can provide driving signals to the first light-emitting element 11 and the second light-emitting element 12 to thereby drive the first light-emitting element 11 and the second light-emitting element 12 to display.

It is noted that the driving circuit 21 can have different configuration locations. For example, the driving circuit can be configured between the first anode 111 and the substrate 10, and/or between the second anode 121 and the substrate 10.

According to some preferred embodiments, the driving circuit 21 is configured between the substrate 10 and the second anode 121 and at a position of the double-sided display panel 1 corresponding to the second anode 121, as illustrated in FIG. 1.

Because the second lights emitted by the second light-emitting element 12 emit out of the double-sided display panel 1 through the second cathode 123 upward to thereby exit out of the top surface of the display panel 1 (as illustrated by the upward arrow in FIG. 1), by configuring the driving circuit 21 at a position of the double-sided display panel 1 that corresponds to the second anode 121 (i.e. below the second anode 121 and above the substrate 10), the driving circuit 21 does not block the second lights shedding out from the light-emitting side of the second light-emitting element 12 (i.e. the top surface shown in FIG. 1).

In addition, because the driving circuit 21 is not arranged within the first light-emitting element 11, it also does not block the first lights shedding out from the light-emitting side of the first light-emitting element 12 the light-emitting side of the second light-emitting element 12 (i.e. the bottom surface shown in FIG. 1).

Due to the above configuration, the aperture of the double-sided display panel 1 at each display side is not compromised, and in turn, the display effect of the double-sided display panel 1 is further improved.

It should be noted that in the embodiments of the double-sided display panel described above, a signal output terminal of the driving circuit 21 can be electrically connected or coupled to each of the first anode 111 and/or the second anode 121 through a conductive material disposed in a via 4, as illustrated in FIG. 2.

Depending on different display types of the double-sided display panel, according to some embodiments, the driving circuit 21 has different configurations (including different components and different structures, etc.) in accordance to the different display types.

In the following, two specific structures are illustratively described and shown in several figures, and the working process of the driving circuit 21 corresponding to their different structures will also be described.

Figure 6:
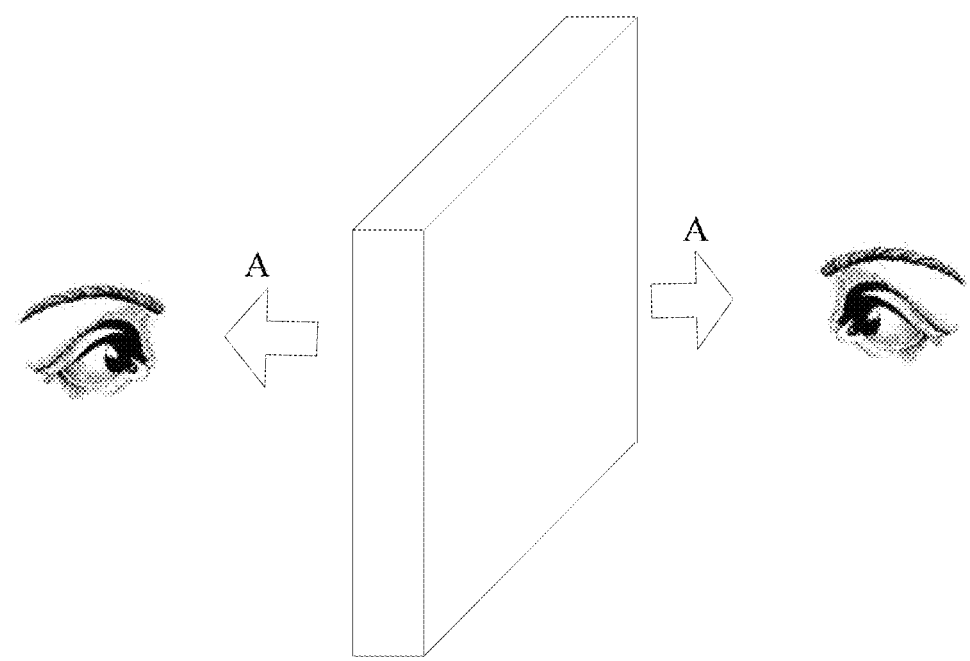
FIG. 6 is a diagram illustrating that same contents can be displayed by the two sides of the double-sided display panel according to some embodiments of the present disclosure.

In a first display type, the double-sided display panel is configured to display substantially same images at both of the two display surfaces, as illustrated in FIG. 1 and FIG. 6. Herein, in these embodiments of the double-sided display panel, the driving circuit 21 comprises a pixel compensation circuit, and a signal output terminal of the pixel compensation circuit is electrically connected to both the first anode 111 and the second anode 121, respectively.

Specifically, a substantially common driving signal can be outputted to the first anode 111 in the first light-emitting element 11 and the second anode 121 of the second light-emitting element 12 from the signal output terminal of the pixel compensation circuit to thereby simultaneously drive the first light-emitting element 11 and the second light-emitting element 12 to emit lights (i.e. the first lights and the second lights, respectively). If the display panel 1 is further configured such that the first lights and the second lights are of a substantially same color and with a substantially same brightness, the two display surfaces/display sides of the double-sided display panel 1 can display a substantially same image.

Figure 4:
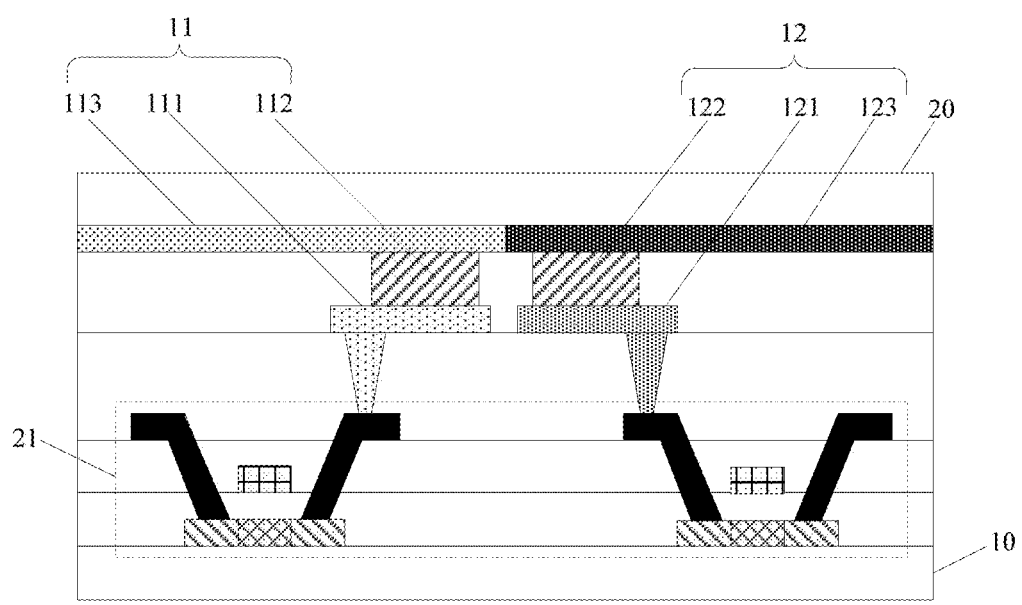
FIG. 4 illustrates a structure of a double-sided display panel according to some other embodiments of the present disclosure.
Figure 5:
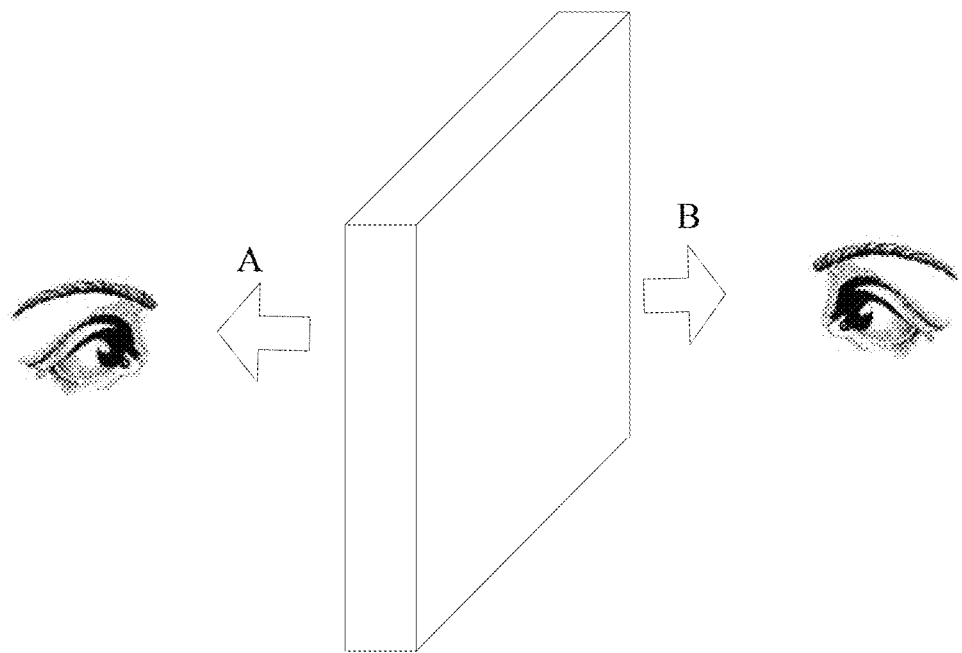
FIG. 5 is a diagram illustrating that different contents can be displayed by the two sides of the double-sided display panel according to some embodiments of the present disclosure.
Figure 9:
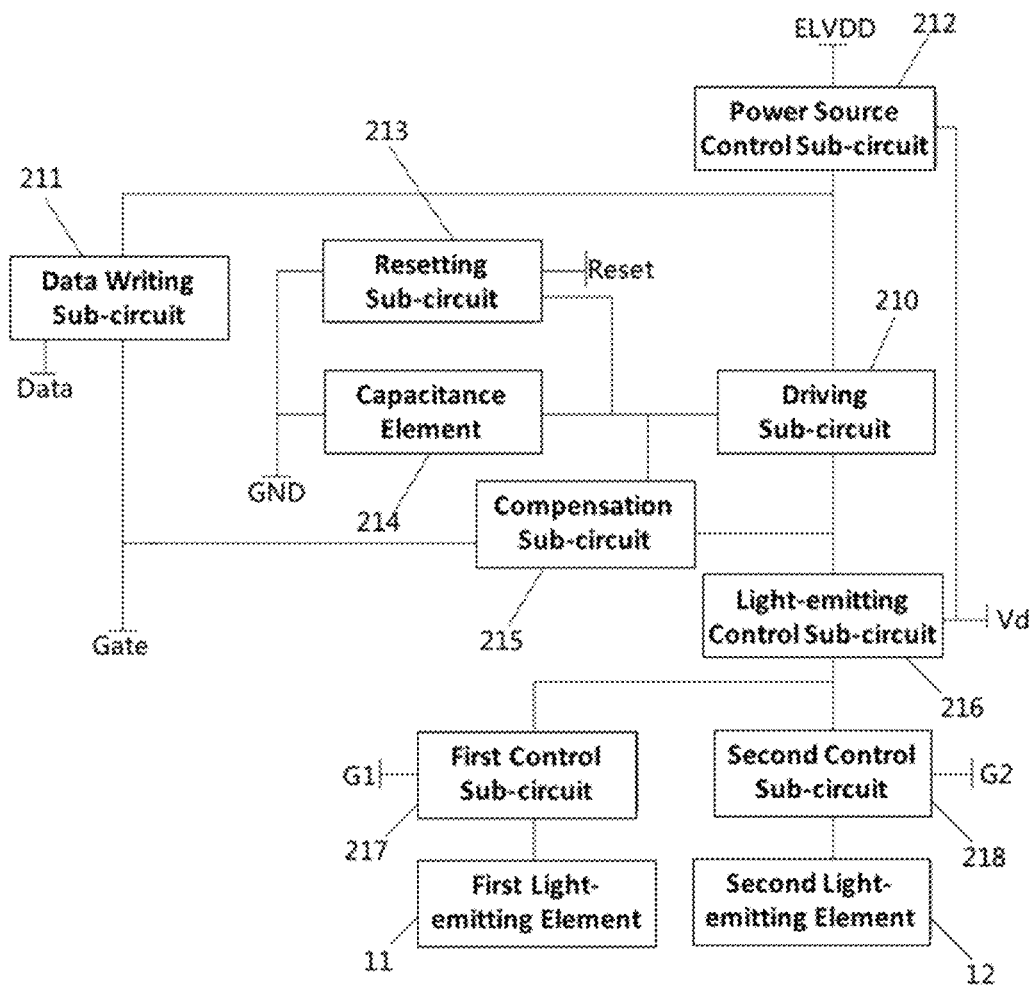
FIG. 9 is a block diagram of a structure of the driving circuit according to some embodiments of the present disclosure.

In a second display type, the double-sided display panel is configured to display different images at the two display surfaces, as illustrated in FIG. 4, FIG. 5 and FIG. 9. Herein, in these embodiments of the double-sided display panel, the driving circuit 21 comprises a pixel compensation circuit, a first control circuit 217 and a second control circuit 218, as illustrated in FIG. 9.

The first control circuit 217 is electrically connected to the signal output terminal of the pixel compensation circuit and the first anode 111 respectively, and is configured to control whether the signal output terminal electrically connects to the first anode 111. The second control circuit 218 is electrically connected to the signal output terminal of the pixel compensation circuit and the second anode 121, respectively, and is configured to control whether the signal output terminal electrically connects to the second anode 121.

Specifically, the double-sided display panel is configured to have the first display side thereof displays a first image, and the second display side thereof displays a second image. The first control circuit 217 controls an electric connection between the signal output terminal of the pixel compensation circuit and the first anode 111, whereas the second control circuit 218 controls electrical disconnection between the signal output terminal of the pixel compensation circuit and the second anode 121. As a result, the pixel compensation circuit can output a first driving signal to the first anode 111 in the first light-emitting element 11 to thereby realize a display of the first image on the first display side of the double-sided display panel 1, and the pixel compensation circuit can output a second driving signal to the second anode 121 in the second light-emitting element 12 to thereby realize a display of the second image on the second display side of the double-sided display panel 1.

It should be noted that in the above mentioned double-sided display panel having the second display type, the specific structure adopted in the driving circuit 21 can also realize a display of substantially same images on each of the two display sides of the double-sided display panel 1.

Specifically, the first control circuit 217 can control the electrical connection between the signal output terminal of the pixel compensation circuit and the first anode 111, and the second control circuit 218 can simultaneously control the electrical connection between the signal output terminal of the pixel compensation circuit and the second anode 121, so that the pixel compensation circuit can respectively output a substantially same driving signal to the first anode 111 and the second anode 121 (i.e. the first driving signal is substantially same to the second driving signal), thereby realizing the displaying of substantially same images on the two display sides of the double-sided display panel 1.

According to some other embodiments of the double-sided display panel, the driving circuit 21 can comprise a plurality of pixel compensation circuits, which are configured to respectively connect electrically with, and thereby respectively control, the plurality of light-emitting elements in a one-to-one corresponding relationship. In other words, each of the plurality of light-emitting elements (e.g. first light-emitting element 11 or second light-emitting element 12) corresponds to an independent pixel compensation circuit.

In any of the embodiments as described above, the material for the first anode 111 and the material for the first cathode 113 in the first light-emitting element 11, as well as the material for the second anode 121 and the material for the second cathode 123 in the second light-emitting element 12 can have various embodiments, as long as the material for the first anode 111 and the material for the second cathode 123 is transparent conductive material, and the material for the first cathode 113 and the material for the second anode 121 is a reflecting conductive material.

In the following, several specific materials for the first anode 111, the second anode 121, the first cathode 113, and the second anode 123 are illustratingly listed.

In one illustrating example of the double-sided display panel 1, in the first light-emitting element 11, the material for the first anode 111 can be indium tin oxide (ITO) or indium zinc oxide (IZO), thereby the first anode 111 not only has good light transmittance, but also has good conductivity.

The material for the first cathode 113 can be silver/aluminum, or a material having a stacked structure comprising indium zinc oxide and aluminum, thereby the first cathode 113 can have good conductivity and reflectivity at the same time.

In the second light-emitting element 12, the material for the second anode 121 can be silver or a material having a stacked structure comprising silver and indium tin oxide (e.g. ITO/Ag/ITO), thereby the second anode 121 can have good conductivity and reflectivity at the same time. The material for the second cathode 123 can be magnesium-silver alloy or indium zinc oxide, thereby the second cathode can have good conductivity and light transmittance at the same time, and the magnesium-silver alloy adopted in the second cathode 123 can additionally help to form a microcavity to thereby increase the light transmittance therethrough.

In a second aspect, the present disclosure further provides a manufacturing method of the double-sided display panel.

The manufacturing method comprises the following steps:

S101: providing a substrate 10;

Herein the substrate 10 can comprise a glass, or a transparent material other than a glass.

S102: Forming a first anode 111 and a second anode 121 over the substrate 10, wherein the first anode 111 comprises a transparent conductive material, and the second anode 121 comprises a reflecting conductive material;

Specifically, the first anode 111 may be made of indium tin oxide or indium zinc oxide, the second anode 121 may be made of silver or may have a stacked structure comprising alternate layers of silver and indium tin oxide (e.g. ITO/Ag/ITO).

S103: Forming a first light-emitting layer 112 and a second light-emitting layer 122 over the first anode 111 and the second anode 121 respectively.

Specifically, a light-emitting material layer that covers the first anode 111 and the second anode 121 can be formed using a light-emitting material, then a patterning process can be performed over the light-emitting material layer to thereby form the first light-emitting layer 112 over the first anode 111 and the second light-emitting layer 122 over the second anode 121, respectively.

S104: Forming a first cathode 113 and a second cathode 123 over the first light-emitting layer 112 and the second light-emitting layer 122 respectively, wherein the first cathode 113 comprises a reflecting conductive material, and the second cathode 123 comprises a transparent conductive material.

Specifically, the first cathode 113 formed over the first light-emitting layer 112 can comprise silver or aluminum or can comprise a stacked structure comprising alternate layers of indium zinc oxide and aluminum. The second cathode 123 formed over the second light-emitting layer 122 can comprise magnesium-silver alloy or indium zinc oxide.

Optionally, after completing the step S104, the manufacturing method can further comprise:

S105: forming a cover plate 20 over the first cathode 113 and the second cathode 123.

Herein the cover plate 20 can comprise a glass or another transparent material.

By means of the manufacturing method described above, the double-sided display panel having a structure as illustrated in FIG. 1 can be obtained. As mentioned above, the double-sided display panel manufactured thereby can realize a double-sided display, and it additionally has a relatively simple structure, and has a relatively good display effect.

According to some embodiments of the manufacturing method, the aforementioned step 102 of a first anode 111 and a second anode 121 over the substrate 10 specifically comprises the following sub-steps to thereby form the first anode 111:

S1021: Forming a transparent conductive material layer over the substrate 10; and S1022: Performing a first patterning process over the transparent conductive material layer to thereby form the first anode 111.

Herein, the sub-step S1022 can be performed using a conventional photoetching process, which can specifically include:

S1022-1: Forming a first photoresist over the transparent conductive material layer;

S1022-2: Exposing the first photoresist with a first mask to thereby form a first region where the first photoresist is remained and a second region where the first photoresist is removed, wherein the first region corresponds to a region where the first anode 111 is arranged, and the second region corresponds to a region other than the region where the first anode 111 is arranged; and S1022-3: Performing an etching process over the transparent conductive material layer; and S1022-4: Removing the first photoresist.

According to some embodiments of the manufacturing method, the aforementioned step S102 of a first anode 111 and a second anode 121 over the substrate 10 specifically comprises the following sub-steps to thereby form the second anode 121:

S1021': Forming a reflecting conductive material layer; and

S1022': performing a second patterning process over the reflecting conductive material layer to thereby form the second anode 121.

Herein, the sub-step S1022' can similarly be performed using a conventional photoetching process, which can specifically include:

S1022'-1: Forming a second photoresist over the reflecting conductive material layer;

S1022'-2: Exposing the second photoresist with a second mask to thereby form a third region where the second photoresist is remained and a fourth region where the second photoresist is removed, wherein the third region corresponds to a region where the second anode 121 is arranged, and the fourth region corresponds to a region other than the region where the second anode 121 is arranged; and S1022'-3: Performing a second etching process over the reflecting conductive material layer; and S1022'-4: Removing the second photoresist.

Figure 7:
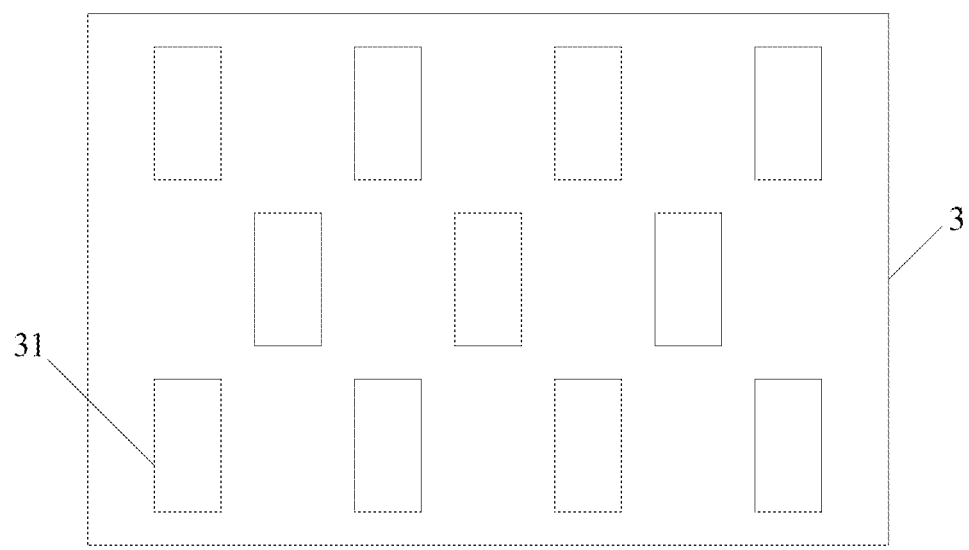
FIG. 7 illustrates a diagram of a mask according to some embodiments of the present disclosure.

In some embodiments as illustrated in FIG. 8, where the plurality of first light-emitting elements 11 and the plurality of second light-emitting elements 12 are alternately arranged in the double-sided display panel 1 and have a substantially same area, the formation of the first cathode 113 and the second cathode 123 in step S104 can be realized through a single mask 3 having a plurality of openings 31 arranged in an array, as illustrated in FIG. 7.

Specifically in step S104, the mask 3 is configured to be utilized twice to thereby form the first cathode 113 in each of the plurality of first light-emitting elements 11 and to form the second cathode 123 in each of the plurality of second light-emitting elements 12, respectively.

For example, according to some embodiments, in a first time of use, the mask 3 can be positioned at a first location such that the plurality of openings 31 of the mask 3 positionally correspond to the plurality of first light-emitting elements 11, to thereby allow the formation of the first cathode 113. Herein the formation of the first cathode 113 can be realized through deposition of a reflecting conductive material (i.e. the first reflecting conductive material) via a first evaporation deposition process.

In a subsequent second time of use, the mask 3 can be positioned at a second location such that the plurality of openings 31 of the mask 3 positionally correspond to the plurality of second light-emitting elements 12, to thereby allow the formation of the second cathode 123. Herein the formation of the second cathode 123 can be realized through deposition of a transparent conductive material (i.e. the second transparent conductive material) via a second evaporation deposition process.

It is noted that in addition to the above embodiments of the step S104 where the first cathode 113 is formed before the second cathode 113, the second cathode 123 can be formed before the first cathode 113, also by means of the same mask 3, according to some other embodiments of the disclosure. The actual orders can be selected depending on actual needs.

It should be noted that in order to ensure a relatively more even distribution for the plurality of light-emitting elements (i.e. the plurality of first light-emitting elements 11 and the plurality of second light-emitting elements 12), the plurality of openings 31 in the mask 3 are arranged such that any two adjacent rows of openings 31 are staggered and any two adjacent columns of openings 31 are staggered, as illustrated in FIG. 7. In other words, for any two adjacent rows of openings 31, no line connecting a first center of a first opening in a first row and a second center of a second opening in a second row is not perpendicular to any row line for the first row and the second row.

During formation of the plurality of first cathodes 113 in step S104, the plurality of first cathodes 113 can be optionally configured to be electrically connected with one another, to thereby ensure that the signal received by all first cathodes 113 is a same first driving signal. Similarly, during formation of the plurality of second cathodes 123 in step S104, the plurality of second cathodes 123 can be configured to be electrically connected with one another, to thereby ensure that the signal received by all second cathodes 113 is a same second driving signal.

In a third aspect, the present disclosure further provides a driving circuit, which can be utilized to drive the double-sided display panel as described above.

Figure 10:
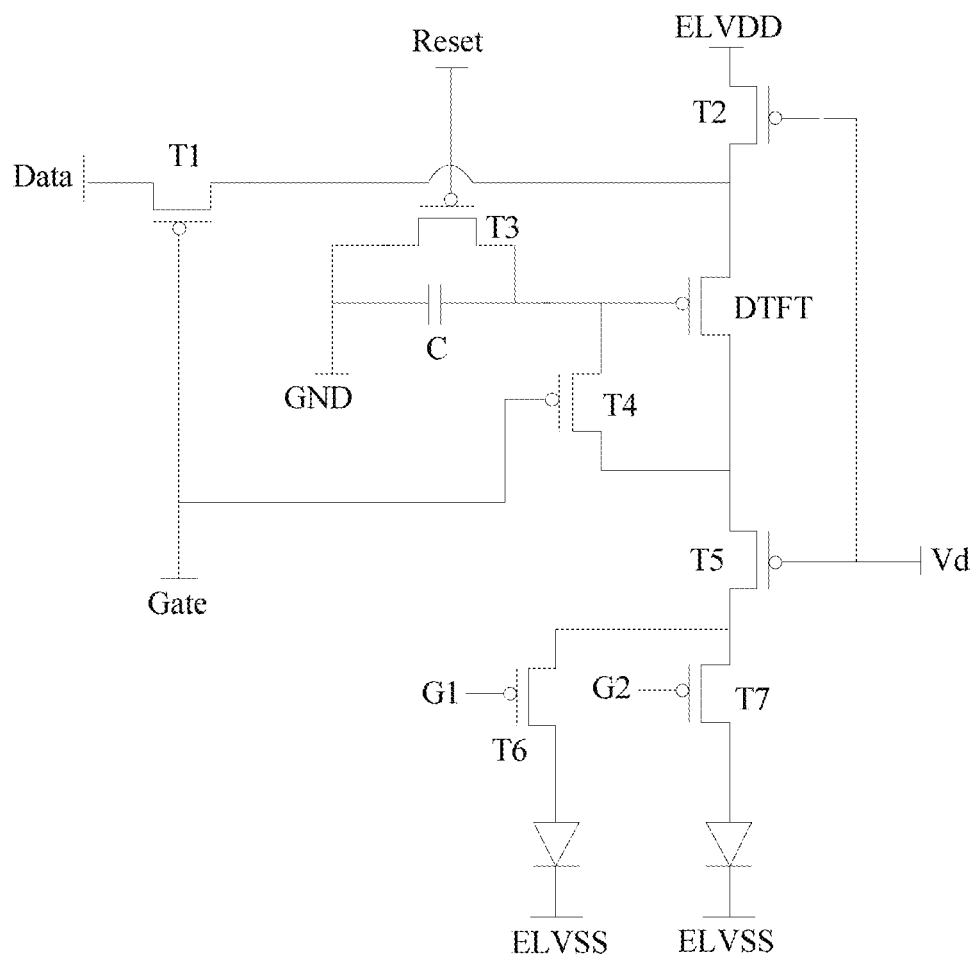
FIG. 10 is a circuit diagram of the driving circuit according to some embodiments of the present disclosure.

According to some embodiments as illustrated in FIG. 9 and FIG. 10, the driving circuit 21 comprises a pixel compensation circuit. Specifically, the pixel compensation circuit comprises a driving sub-circuit 210, a data writing sub-circuit 211, a power source control sub-circuit 212, a resetting sub-circuit 213, a capacitance element 214, and a compensation sub-circuit 215.

The driving sub-circuit 210 can comprise a driving transistor DTFT according to some embodiments of the disclosure illustrated in FIG. 10. A first electrode of the driving transistor DTFT is electrically coupled to a signal output terminal.

The data writing sub-circuit 211 is electrically coupled to a gate line ("Gate") of a corresponding row, a data line ("Data") of a corresponding column, and a second electrode of the driving transistor DTFT, respectively. The data writing sub-circuit 211 is configured to control whether or not to electrically connect the data line Data of the corresponding column and the second electrode of the driving transistor DTFT under control of the gate line Gate of corresponding row.

The power source control sub-circuit 212 is electrically coupled to a power source control terminal Vd, a power source signal input terminal ELVDD, and the second electrode of the driving transistor DTFT, respectively. The power source control sub-circuit 212 is configured to control whether or not to electrically connect the power source signal input terminal ELVDD and the second electrode of the driving transistor DTFT under control of the power source control terminal Vd.

The resetting sub-circuit 213 is electrically coupled to a resetting control terminal ("Reset"), a gate electrode of the driving transistor DTFT, and a first electric level input terminal (which optionally can be a ground terminal GND), respectively. The resetting sub-circuit 213 is configured to control whether or not to electrically connect the gate electrode of the driving transistor DTFT and the first electric level input terminal (i.e. GND) under control of the resetting control terminal Reset.

The capacitance element 214 can comprise a capacitor C according to some embodiments of the disclosure illustrated in FIG. 10. A first terminal of the capacitance element 214 is electrically connected to the gate electrode of the driving transistor DTFT, and a second terminal of the capacitance element 214 is electrically connected to the first electric level input terminal (i.e. GND).

The compensation sub-circuit 215 is electrically coupled to the gate line Gate of corresponding row, the gate electrode of the driving transistor DTFT, and the first electrode of the driving transistor DTFT, respectively. The compensation sub-circuit 215 is configured to control whether or not to electrically connect the gate electrode of the driving transistor DTFT and the first electrode of the driving transistor DTFT under control of the gate line Gate of corresponding row.

According to some embodiments of the disclosure, the driving circuit can further comprise a light-emitting control sub-circuit 216. The first electrode of the driving transistor DTFT is connected to the signal output terminal through the light-emitting control sub-circuit 216. The light-emitting control sub-circuit 216 is electrically coupled to the power source control terminal Vd, the first electrode of the driving transistor DTFT, and the signal output terminal, respectively. The light-emitting control sub-circuit 216 is configured to control whether or not to electrically connect the first electrode of the driving transistor DTFT and the signal output terminal under control of the power source control terminal Vd.

Figure 11:
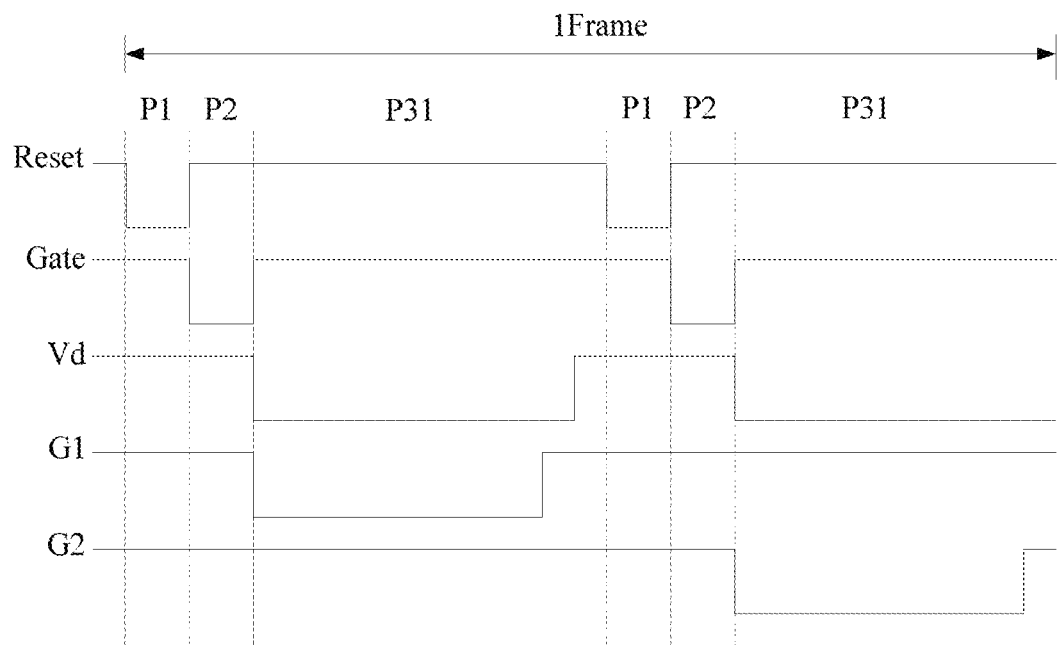
FIG. 11 is a time-series diagram of a working process of a driving circuit according to some embodiments of the present disclosure.
Figure 12:
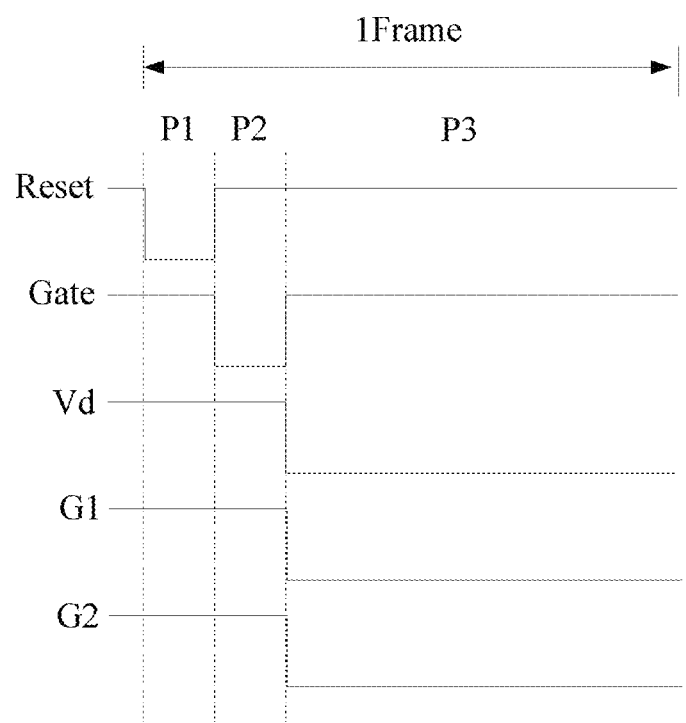
FIG. 12 is a time-series diagram of a working process of a driving circuit according to some other embodiments of the present disclosure.

As shown in FIG. 11 and FIG. 12, the working process of the aforementioned pixel compensation circuit comprises a resetting stage P1 and a discharge compensation stage P2, and a light-emitting stage P3.

Specifically, during the resetting stage P1, the first electric level input terminal (i.e. GND) receives the first electric level; then under control of the resetting control terminal Reset, the resetting sub-circuit 213 controls that the gate electrode of the driving transistor DTFT is electrically connected with the first electric level input terminal (i.e. GND), such that the electric level of the gate electrode of the driving transistor DTFT receives the first electric level from the first electric level input terminal (i.e. GND); then under control of the power source control terminal Vd, the power source control sub-circuit 212 is in a non-operating state, thereby controlling that the power source signal input terminal ELVDD is electrically disconnected with the second electrode of the driving transistor DTFT.

It should be noted that during this resetting stage P1, the two terminals (i.e. the first terminal and the second terminal) of the capacitance element 214 can be reset to the first electric level, so that the influence of the original gate electrode of the driving transistor DTFT can be eliminated.

During the discharge compensation stage P2, under control of the first electric level, the driving transistor DTFT is turned on; then under control of the resetting control terminal Reset, the resetting sub-circuit 213 controls that the gate electrode of the driving transistor DTFT is electrically disconnected with the first electric level input terminal; under control of the power source control terminal Vd, the power source control sub-circuit 212 is in the non-operating state, which continues to control that the power source signal input terminal ELVDD is electrically disconnected with the second electrode of the driving transistor DTFT.

The data line Data of corresponding column inputs a data voltage; the gate line Gate of corresponding row inputs a gate electrode driving signal. The gate electrode driving signal controls the data writing sub-circuit 211 to be in an operating state, thereby controlling that the data line Data of corresponding column is electrically connected with the second electrode of the driving transistor DTFT.

At the same time, the gate electrode driving signal controls the compensation sub-circuit 215 to be in an operation state, thereby controlling that the gate electrode of the driving transistor DTFT is electrically connected with the first electrode of the driving transistor DTFT, so that the data voltage Vdata in turn passes through the data writing sub-circuit 211, the driving transistor DTFT, and the compensation sub-circuit 215 to be written into the gate electrode of the driving transistor DTFT, until the electric level of the gate electrode of the driving transistor DTFT becomes Vdata+Vth. Herein Vth is a threshold voltage of the driving transistor DTFT (i.e. voltage difference between the gate electrode and the source electrode of the driving transistor DTFT that can drive the driving transistor DTFT), and the Vdata+Vth is stored in the capacitance element 214.

It should be noted that when the first electric level input terminal is connected to the ground, the electric level of the second terminal o the capacitance element 214 is always 0, therefore, when the electric level of the gate electrode of the driving transistor DTFT becomes Vdata+Vth (i.e. the electric level of the first terminal of the capacitance element 214 becomes Vdata+Vth), the electric level of the gate electrode of the driving transistor DTFT will always remain at Vdata+Vth.

During the light-emitting stage P3, under control of the gate line Gate of corresponding row, the data writing sub-circuit 211 and the compensation sub-circuit 215 are both in a non-operating state; under control of the power source control terminal Vd, the power source control sub-circuit 212 is in an operating state, therefore controlling that the power source signal input terminal ELVDD is electrically connected with the second electrode of the driving transistor DTFT, such that the power source input signal Vdd inputted from the power source signal input terminal ELVDD is transmitted to the second electrode of the driving transistor DTFT.

Thus under the combined action of the electric level of the gate electrode of the driving transistor DTFT and the power source signal Vdd, the driving transistor DTFT is turned on, thereby realizing the output of the driving signal from the signal output terminal.

Herein it should be noted that when the signal output terminal is electrically connected to the light-emitting element, the driving signal drives the light-emitting element to emit light, and the working current that is generated is as follows:

$$I_D=K(Vgs-Vth)^2=K(V\text{data}+Vth-Vdd-Vth)^2=K(V\text{data}-Vdd)^2;$$

where K is a constant.

From the above formula, it can be seen that the working current $I_D$ is only related to Vdata. Therefore, the problem of threshold voltage drift caused by the manufacturing process or by the long working time, etc., which in turn negatively influences the working current of the light-emitting element, can thus be completely solved, thereby a stable working state of the light-emitting element can be ensured.

In addition, during the process of driving the driving circuit 21 as described above, the first electrode of the driving transistor DTFT is electrically connected to the signal output terminal, and the signal output terminal is electrically connected to the first anode 111 of the first light-emitting element 11 and the second anode 121 of the second light-emitting element 12 in the double-sided display panel 1, respectively. As such, the driving signal can be provided to both the first anode 111 and the second anode 121 to thereby allow the first light-emitting element 11 and the second light-emitting element 12 to emit lights, in turn realizing a dual display for the display panel 1.

As described above and illustrated in FIG. 9, some embodiments of the driving circuit 21 comprise a light-emitting control sub-circuit 216.

In these embodiments of the double-sided display panel, during the resetting stage P1 and the discharge compensation stage P2, under control of the power source control terminal Vd, the light-emitting control sub-circuit 216 controls that the first electrode of the driving transistor STFT is electrically disconnected with the signal output terminal. During the light-emitting stage P3, under control of the power source control terminal Vd, the light-emitting control sub-circuit 216 controls that the first electrode of the driving transistor STFT is electrically connected with the signal output terminal.

It can be seen that during the resetting stage P1 and the discharge compensation stage P2, because the light-emitting control sub-circuit 216 can control the first electrode of the driving transistor STFT to be electrically disconnected with the signal output terminal, the issue that the electric current generated by the driving transistor DTFT during these two stages flows through the light-emitting element can thus be avoided, reducing the consumption of the light-emitting element.

According to some embodiments of the double-sided display panel, the aforementioned driving circuit 21 further comprises a first control circuit 217 and a second control circuit 218.

The first control circuit 217 is electrically connected to the first control terminal G1, the signal output terminal, and the first anode 111, respectively, and is configured to control whether or not the signal output terminal is electrically connected with the first anode 111 under control of the first control terminal G1.

The second control circuit 218 is electrically connected to the second control terminal G2, the signal output terminal, and the second anode 121, respectively, and is configured to control whether or not the signal output terminal is electrically connected with the second anode 121 under control of the second control terminal G2.

It should be noted that in these embodiments described herein, the first cathode 113 and the second cathode 123 can be both electrically connected to the power source negative electrode ELVSS.

FIG. 11 illustrated a working process of the driving circuit 21 described above within the time of displaying one image frame.

Specifically, as shown in FIG. 11, during the resetting stage P1 and the discharge compensation stage P2, under control of the first control terminal G1, the first control circuit 217 controls that the signal output terminal is electrically disconnected with the first anode 111; under control of the second control terminal G2, the second control circuit 218 controls that the signal output terminal electrically disconnected with the second anode 211. As such, during the resetting stage P1 and the discharge compensation stage P2, no abnormal driving signal will be transmitted to the first anode 111 and the second anode 121, and the consumption of the first light-emitting element 11 and the second light-emitting element 12 can be reduced.

During the first phrase P31 of the light-emitting stage P3, under control of the first control terminal G1, the first control circuit 217 controls that the signal output terminal is electrically connected with the first anode 111; under control of the second control terminal G2, the second control circuit 218 controls that the signal output terminal is electrically disconnected with the second anode 121. As a result, the first driving signal generated by the pixel compensation circuit will be to transmitted to the first anode 111.

During the second phrase P32 of the light-emitting stage P3, under control of the first control terminal G1, the first control circuit 217 controls that the signal output terminal is electrically disconnected with the first anode 111; under control of the second control terminal G2, the second control circuit 218 controls that the signal output terminal is electrically connected with the second anode 121. As a result, the second driving signal 218 generated by the pixel compensation circuit will be transmitted to the second anode 121.

It should be noted, when the aforementioned driving method is employed to drive the double-sided display panel to display, the double-sided display panel can have only one side to display depending on certain practical needs. In this case, the side that does not display can be turned off, therefore the consumption can be reduced and the working life of the device can be prolonged.

The working methods of the aforementioned first control circuit 217 and the second control circuit 218 can respectively achieve the transmission of different driving signals to the first anode 111 and the second anode 121. As a result, the two display sides of the double-sided display panel 1 can display different pictures.

It is further noted that the aforementioned embodiments of the driving circuit 21 can also control the two display sides of the double-sided display panel 1 to display substantially same images at the same time.

Specifically, as shown in FIG. 12, within the time of displaying one frame, during the resetting stage P1 and the discharge compensation stage P2, under control of the first control terminal G1, the first control circuit 217 controls the electrical connection between the signal output terminal and the first anode 111 to be turned off; under the control of the second control terminal G2, the second control circuit 218 controls the electrical connection between the signal output terminal and the second anode 121 to be turned off.

During the light-emitting stage P3, under control of the first control terminal G1, the first control circuit 217 controls the electrical connection between the signal output terminal and the first anode 111 to be turned on; under control of the second control terminal G2, the second control circuit 218 controls the electrical connection between the signal output terminal and the second anode 121 to be turned on.

Under this driving method, the same driving signal outputted by the driving circuit 21 can be respectively transmitted to the first anode 111 and the second anode 121. As a result, a same picture can be displayed on the two display sides of the double-sided display panel 1.

In the driving circuit 21 disclosed herein, the structures of the data writing sub-circuit 211, the power source control sub-circuit 212, the resetting sub-circuit 213, the compensation sub-circuit 215, the light-emitting control sub-circuit 216, the first control circuit 217 and the second control circuit 218 may be varied depending on different embodiments of the disclosure.

In the following, a structure of each sub-circuit, the first control circuit 217 and the second control circuit 218 will be described in detail according to a specific embodiment for illustrating purposes, which is illustrated in FIG. 10.

In the embodiment, the data writing sub-circuit 211 comprises a first switch transistor T1. A gate electrode of the first switch transistor T1 is electrically connected to the gate line Gate of corresponding row; a first electrode of the first switch transistor T1 is electrically connected to the second electrode of the driving transistor DTFT; and a second electrode of the first switch transistor T1 is connected to the data line Data of corresponding column.

The power source control sub-circuit 212 comprises a second switch transistor T2. A gate electrode of the second switch transistor T2 is electrically connected to the power source control terminal Vd; a first electrode of the second switch transistor T2 is electrically connected to the second electrode of the driving transistor DTFT; and a second electrode of the second switch transistor T2 is electrically connected to the power source signal input terminal ELVDD.

The resetting sub-circuit 213 comprises a third switch transistor T3. A gate electrode of the third switch transistor T3 is electrically connected to the resetting control terminal Reset; a first electrode of the third switch transistor T3 is electrically connected to the gate electrode of the driving transistor DTFT; and a second electrode of the third switch transistor T3 is electrically connected to the first electric level input terminal (i.e. GND).

The compensation sub-circuit comprises a fourth switch transistor T4. A gate electrode of the fourth switch transistor T4 is electrically connected to the gate line Gate of corresponding row; a first electrode of the fourth switch transistor T4 is electrically connected to the gate electrode of the driving transistor DTFT; and a second electrode of the fourth switch transistor T4 is electrically connected to the first electrode of the driving transistor DTFT.

The light-emitting control sub-circuit 216 comprises a fifth switch transistor T5. A gate electrode of the fifth switch transistor T5 is electrically connected to the power source control terminal Vd; a first electrode of the fifth switch transistor T5 is electrically connected to the signal output terminal; and a second electrode of the fifth switch transistor T5 is electrically connected to the first electrode of the driving transistor DTFT.

The first control circuit 217 comprises a sixth switch transistor T6. A gate electrode of the sixth switch transistor T6 is electrically connected to the first control terminal G1; a first electrode of the sixth switch transistor T6 is electrically connected to the first anode 111; and a second electrode of the sixth switch transistor T6 is electrically connected to the signal output terminal.

The second control circuit 218 comprises a seventh switch transistor T7. A gate electrode of the seventh switch transistor T7 is electrically connected to the second control terminal G2; a first electrode of the seventh switch transistor T7 is electrically connected to the second anode 121; and a second electrode of the seventh switch transistor T7 is electrically connected to the signal output terminal.

It should be noted that each of the aforementioned driving transistor DTFT and all of the above switch transistors (T1-T7) may be a thin film transistor, a field effect transistor, or another component(s) with similar characteristics. In embodiments of the present disclosure, in order to distinguish the two electrodes other than the gate electrode of the driving transistor DTFT and each switch transistor, one electrode is called the first electrode, the other electrode is called the second electrode. In practical applications, the first electrode may be the drain electrode, the second electrode may be the source electrode; or alternatively the first electrode may be the source electrode, the second electrode may be the drain electrode. In addition, the driving transistor DTFT and each switch transistor may either be of an N-type or of a P-type according to practical needs.

In a fourth aspect, the present disclosure further provides a method of driving the driving circuit as described above in the third aspect. The driving method comprises a resetting stage P1, a discharge compensation stage P2, and a light-emitting stage P3.

During the resetting stage P1, under control of the resetting control terminal Reset, the resetting sub-circuit 213 controls the electrical connection between the gate electrode of the driving transistor DTFT and the first electric level input terminal to be turned on, so that the electric level of the gate electrode of the driving transistor DTFT will be changed to the first electric level.

Specifically, during the resetting stage P1, the first electric level input terminal inputs the first electric level, under control of the resetting control terminal Reset, the resetting sub-circuit controls the connections between the gate electrode of the driving transistor DTFT and the first electric level input terminal to be turned on, so that the electric level of the gate electrode of the driving transistor DTFT becomes the first electric level. Under control of the power source control terminal Vd, the power source control sub-circuit 212 is in non-operating state, therefore controlling the electrical connection between the power source signal input terminal ELVDD and the second electrode of the driving transistor DTFT to be turned off. It should be noted that during the resetting stage P1, the two terminals of the capacitance element 214 are reset to the first electric level to eliminate the influence of the original gate of the driving transistor DTFT.

During the discharge compensation stage P2, the first electric level controls the driving transistor DTFT to be turned on; the data line Data of corresponding column inputs the data signal Vdata, and under control of the gate line Gate of corresponding row, the data writing sub-circuit 2111 controls the electrical connection between the data line Data of corresponding column and the second electrode of the driving transistor DTFT to be turned on, and the compensation sub-circuit 215 controls the electrical connection between the gate electrode of the driving transistor DTFT and the first electric level input terminal to be turned on, so that the data signal Vdata will in turn pass the data writing sub-circuit 211, the driving transistor DTFT and the compensation sub-circuit 215 to charge the gate electrode of the driving transistor DTFT, until the electric level of the gate electrode of the driving transistor DTFT is changed to Vdata+Vth, where Vth is a threshold voltage of the driving transistor DTFT.

Specifically, during the discharge compensation stage P2, under control of the first electric level, the driving transistor DTFT is on; under control of the resetting control terminal Reset, the resetting sub-circuit 213 controls the electrical connection between the gate electrode of the driving transistor DTFT and the first electric level to be turned off; under control of the power source control terminal Vd, the power source control sub-circuit 212 is in non-operating state, continuing to control the electrical connection between the power source signal input terminal ELVDD and the second electrode of the driving transistor DTFT to be turned off; the data line Data of corresponding column inputs the data voltage, the gate line Gate of corresponding row inputs the gate driving signal, the date driving signal controls the data writing sub-circuit 211 to be in operating state, such that the electrical connection between the data line Data of corresponding column and the second electrode of the driving transistor DTFT is on; at the same time, the gate driving signal controls the compensation sub-circuit 215 to be in operating state, thus controls the gate electrode of the driving transistor DTFT and the first electrode of the driving transistor DTFT to be turned on, so that the data voltage Vdata will in turn pass through the data writing sub-circuit 211, the driving transistor DTFT and the compensation sub-circuit 215 and will be further written into the gate electrode of the driving transistor DTFT, until the electric level of the gate electrode of the driving transistor DTFT becomes Vdata+Vth; and the Vdata+Vth is stored in the capacitance element 214.

During the light-emitting stage P3, under control of the power source control terminal Vd, the power source control sub-circuit 212 controls the electrical connection between the power source signal input terminal ELVDD and the second electrode of the driving transistor DTFT to be turned on, and the driving transistor DTFT generates driving signal and outputs the driving signal from the signal output terminal.

Specifically, during the light-emitting stage P3, under control of the gate line Gate of corresponding row, the data writing sub-circuit 211, the compensation sub-circuit 215 are both in non-operating state; under the control of the power source control terminal Vd, the power source control sub-circuit 212 is in operating state, thus controls the electrical connection between the power source signal input terminal ELVDD and the second electrode of the driving transistor DTFT to be turned on; the power source signal Vdd inputted by the power source signal input terminal ELVDD is transmitted to the second electrode of the driving transistor DTFT. Under the combined action of the electric level of the gate electrode of the driving transistor DTFT and the power source signal Vdd, the driving transistor is on, therefore the outputting of driving signal from the signal output terminal is achieved.

When the aforementioned driving method according to some embodiments of the present disclosure is adopted to drive the aforementioned driving circuit 21, the problem of threshold voltage drift of the driving transistor DTFT caused by manufacturing process or long working time that influence the working current of the light-emitting element is completely solved, the stable working state of the light-emitting element is ensured.

In addition, when the aforementioned driving method according to some embodiments of the present disclosure is adopted to drive the aforementioned driving circuit 21, the driving circuit 21 can be controlled to respectively provide driving signal to the first anode 111 and the second anode 121 in the double-sided display panel 1, the double-sided display function of the double-sided display panel 1 is therefore achieved.

In some embodiments where the driving circuit 21 further comprises a light-emitting control sub-circuit 216, the driving method will be as followed:

During the resetting stage P1 and the discharge compensation stage P2, under control of the power source control terminal Vd, the light-emitting control sub-circuit 216 controls the electrical connection between the first electrode of the driving transistor DTFT and the signal output terminal to be turned off;

During the light-emitting stage P3, under the control of the power source control terminal Vs, the light-emitting control sub-circuit 216 controls the electrical connection between the first electrode of the driving transistor DTFT and the signal output terminal to be turned on, so that the driving signal will be outputted from the signal output terminal through the light-emitting control sub-circuit 216.

It can be seen that because during the resetting stage P1 and the discharge compensation stage P2, the light-emitting control sub-circuit 216 can control the electrical connection between the first electrode of the driving transistor DTFT and the signal output terminal to be turned off, therefore the electric current generated by the driving transistor DTFT during these two stages will not flow through the light-emitting element, the consumption of the light-emitting element is therefore reduced.

In some embodiments where the driving circuit 21 further comprises a first control circuit 217 and a second control circuit 218, the light-emitting stage P3 comprises a first phrase P31 and a second phrase P32. Accordingly, the driving method will be as followed.

During the resetting stage P1 and the discharge compensation stage P2, under the control of the first control terminal G1, the first control circuit 217 controls the electrical connection between the signal output terminal and the first anode 111 to be turned off; under the control of the second control terminal G2, the second control circuit 218 controls the electrical connection between the signal output terminal and the second anode 121 to be turned off; as a result, during the resetting stage P1 and the discharge compensation stage P2, no abnormal driving signal will be transmitted to the first anode 111 and the second anode 121, the consumption of the first light-emitting element 11 and the second light-emitting element 12 is reduced.

During the first phrase P31, under the control of the first control terminal G1, the first control circuit 217 controls the electrical connection between the signal output terminal and the first anode 111 to be turned on; in addition, under the control of the second control terminal G2, the second control circuit 218 controls the electrical connection between the signal output terminal and the second anode to be turned off, therefore, the first driving signal generated by the pixel compensation circuit will be transmitted to the first anode 111.

During the second phrase P32, under the control of the first control terminal G1, the first control circuit 217 controls the electrical connection between the signal output terminal and the first anode 111 to be turned off; under the control of the second control terminal G2, the second control circuit 218 controls the electrical connection between the signal output terminal and the second anode 121 to be turned on, therefore, the second driving signal generated by the pixel compensation circuit will be transmitted to the second anode 121.

In the driving method described above, different driving signals can be respectively transmitted to the first anode 111 and the second anode 121, thus the two display sides of the double-sided display panel 1 can display different pictures.

In some embodiments where the driving circuit 21 further comprises the first control circuit 217 and the second control circuit 218, the driving method can comprise the following:

During the resetting stage P1 and the discharge compensation stage P2, under the control of the first control terminal G1, the first control circuit 217 controls the electrical connection between the signal output terminal and the first anode 11 to be turned off; under the control of the second control terminal G2, the second control circuit 218 controls the electrical connection between the signal output terminal and the second anode 121 to be turned off;

During the light-emitting stage P3, under the control of the first control terminal G1, the first control circuit 217 controls the electrical connection between the signal output terminal and the first anode 111 to be turned on; under the control of the second control terminal G2, the second control circuit 218 controls the electrical connection between the signal output terminal and the second anode 121 to be turned on.

In the driving method disclosed above, the same driving signal outputted by the driving circuit 21 will be respectively transmitted to the first anode 111 and the second anode 121, thus the two display sides of the double-sided display panel 1 will display substantially same picture.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A driving circuit for driving a display panel, the display panel comprising:
   a substrate; and
   a plurality of display elements over the substrate, each comprising at least one first light-emitting element and at least one second light-emitting element, configured to respectively emit a first light out of a first light-emitting surface, and a second light out of a second light-emitting surface opposing to the first light-emitting surface, of the display panel, wherein:
      each of the at least one first light-emitting element comprises a first light-emitting layer sandwiched between two first electrodes, wherein the two first electrodes are configured to be respectively transparent and reflective so that the first light emitted by the first light-emitting layer transmits out of the first light-emitting surface of the display panel;
      each of the at least one second light-emitting element comprises a second light-emitting layer sandwiched between two second electrodes, wherein the two second electrodes are configured to be respectively transparent and reflective so that the second light emitted by the second light-emitting layer transmits out of the second light-emitting surface of the display panel;
   wherein:
      the first light-emitting surface is below the substrate; and
      the second light-emitting surface is over the substrate;
   the driving circuit comprising a pixel compensation circuit, wherein the pixel compensation circuit comprises a driving sub-circuit, a data writing sub-circuit, a power source control sub-circuit, a resetting sub-circuit, a capacitance element, and a compensation sub-circuit, wherein:
   the driving sub-circuit comprises a driving transistor, wherein a first electrode of the driving transistor is electrically coupled to a signal output terminal of the pixel compensation circuit;
   the data writing sub-circuit is electrically coupled to a gate line of a corresponding row, a data line of a corresponding column, and a second electrode of the driving transistor, respectively, and is configured to control whether or not to electrically connect the data line and the second electrode of the driving transistor under control of the gate line;
   the power source control sub-circuit is electrically coupled to a power source control terminal, a power source signal input terminal, and the second electrode of the driving transistor, respectively, and is configured to control whether or not to electrically connect the power source signal input terminal and the second electrode of the driving transistor under control of the power source control terminal;
   the resetting sub-circuit is electrically coupled to a resetting control terminal, a gate electrode of the driving transistor, and a first electric level input terminal, respectively, and is configured to control whether or not to electrically connect the gate electrode of the driving transistor and the first electric level input terminal under control of the resetting control terminal;
   the capacitance element comprises a first terminal and a second terminal, wherein the first terminal and the second terminal are electrically connected to the gate electrode of the driving transistor, and to the first electric level input terminal, respectively;
   the compensation sub-circuit is electrically coupled to the gate line, the gate electrode of the driving transistor, and the first electrode of the driving transistor, respectively, and is configured to control whether or not to electrically connect the gate electrode of the driving transistor and the first electrode of the driving transistor under control of the gate line.

2. The driving circuit of claim 1, wherein:
in each of the at least one first light-emitting element, the two first electrodes comprise a first anode and a first cathode, wherein:
   the first anode, the first light-emitting layer, and the first cathode are sequentially disposed over the substrate;
   the first anode comprises a first transparent conductive material; and
   the first cathode comprises a first reflecting conductive material; and
in each of the at least one second light-emitting element, the two second electrodes comprise a second anode and a second cathode, wherein:

the second anode, the second light-emitting layer, and the second cathode are sequentially disposed over the substrate;

the second anode comprises a second reflecting conductive material; and the second cathode comprises a second transparent conductive material.

3. The driving circuit of claim 1, wherein each of the plurality of display elements further comprises a driving circuit, configured to provide driving signals to each of the at least one first light-emitting element and each of the at least one second light-emitting element.

4. The driving circuit of claim 3, wherein the driving circuit is arranged between a substrate and one of the two second electrodes that is reflective, configured such that an orthographic projection of the driving circuit on the substrate is at least partially overlapped with an orthographic projection of the one of the two second electrodes on the substrate.

5. The driving circuit of claim 3, wherein the driving circuit comprises a pixel compensation circuit, having a signal output terminal thereof electrically coupled to each of the at least one first light-emitting element and each of the at least one second light-emitting element such that each of the at least one first light-emitting element and each of the at least one second light-emitting element receives substantially same driving signals from the pixel compensation circuit.

6. The driving circuit of claim 3, wherein the driving circuit further comprises a first control circuit and a second control circuit, wherein:

the first control circuit is electrically coupled to a signal output terminal of the pixel compensation circuit and the at least one first light-emitting element respectively, and is configured to control whether or not the signal output terminal of the pixel compensation circuit is electrically connected to the each of the at least one second light-emitting element; and the second control circuit is electrically coupled to the signal output terminal of the pixel compensation circuit and the at least one second light-emitting element respectively, and is configured to control whether or not the signal output terminal of the pixel compensation circuit is electrically connected to the each of the at least one second light-emitting element.

7. The driving circuit of claim 1, wherein in each of the plurality of display elements, a number of the at least one first light-emitting element is different from a number of the at least one second light-emitting element.

8. The driving circuit of claim 1, wherein in each of the plurality of display elements, a number of the at least one first light-emitting element is equal to a number of the at least one second light-emitting element, wherein:

an area of a first light-emitting region formed by each of the at least one first light-emitting element is substantially equal to an area of a second light-emitting region formed by each of the at least one second light-emitting element.

9. The driving circuit of claim 8, wherein each of the plurality of display elements consists of one first light-emitting element and one second light-emitting element.

10. The driving circuit of claim 1, wherein the at least one first light-emitting element in each of the plurality of display elements together form a plurality of first light-emitting elements, and the at least one second light-emitting element in each of the plurality of display elements together form a plurality of second light-emitting elements, wherein:

the plurality of first light-emitting elements and the plurality of second light-emitting elements are alternately arranged.

11. The driving circuit of claim 2, wherein at least one pair of the first anode and the second anode, the first light-emitting layer and the second light-emitting layer, and the first cathode and the second cathode are arranged at a substantially same layer.

12. The driving circuit of claim 2, wherein the first transparent conductive material comprises at least one of indium tin oxide (ITO) or indium zinc oxide (IZO).

13. The driving circuit of claim 2, wherein the second transparent conductive material comprises at least one of a magnesium-silver alloy or indium zinc oxide (IZO).

14. The driving circuit of claim 2, wherein the first reflecting conductive material comprises at least one of a silver-aluminum alloy, or a material having a stacked structure comprising IZO and aluminum.

15. The driving circuit of claim 2, wherein the second reflecting conductive material comprises at least one of silver or a material having a stacked structure comprising silver and indium tin oxide.

16. The driving circuit according to claim 1, wherein the first electric level input terminal is a ground terminal.

17. The driving circuit according to claim 1, further comprising a light-emitting control sub-circuit, wherein the light-emitting control sub-circuit is electrically coupled to the power source control terminal, the first electrode of the driving transistor, and the signal output terminal, respectively, and is configured to control whether or not to electrically connect the first electrode of the driving transistor and the signal output terminal under control of the power source control terminal.

18. The driving circuit according to claim 1, further comprising a first control circuit and a second control circuit, wherein:

the first control circuit comprises at least one first control sub-circuit, wherein each of at least one first control sub-circuit is electrically coupled to the signal output terminal of the pixel compensation circuit, a first control terminal, and one of two first electrodes in each of the at least one first light-emitting element, respectively, and is configured to control whether or not the signal output terminal of the pixel compensation circuit is electrically connected to the one of two first electrodes under control of the first control terminal; and the second control circuit comprises at least one second control sub-circuit, wherein each of at least one second control sub-circuit is electrically coupled to the signal output terminal of the pixel compensation circuit, a second control terminal, and one of two second electrodes in each of the at least one second light-emitting element, respectively, and is configured to control whether or not the signal output terminal of the pixel compensation circuit is electrically connected to the one of two second electrodes under control of the first control terminal.

19. A method for driving the driving circuit according to claim 1, the method comprising:

a resetting stage, in which under control of the resetting control terminal, the resetting sub-circuit controls that the gate electrode of the driving transistor is electrically connected with the first electric level input terminal, such that an electric level of the gate electrode of the driving transistor receives a first electric level from the first electric level input terminal;

a discharge compensation stage, in which the first electric level controls that the driving transistor is turned on; the data line of corresponding column inputs a data voltage Vdata; under control of the gate line of corresponding row, the data writing sub-circuit controls that the data line of corresponding column is electrically connected with the second electrode of the driving transistor; the compensation sub-circuit controls that the gate electrode of the driving transistor is electrically connected with the first electrode of the driving transistor, so that the data voltage Vdata in turn passes through the data writing sub-circuit, the driving transistor, and the compensation sub-circuit to be written into the gate electrode of the driving transistor, until the electric level of the gate electrode of the driving transistor becomes Vdata+Vth, wherein Vth is a threshold voltage of the driving transistor; and a light-emitting stage, in which under control of the power source control terminal, the power source control sub-circuit controls that the power source signal input terminal is electrically connected with the second electrode of the driving transistor; then the driving transistor generates, and output from the signal output terminal, a driving signal.

* * * * *